United States Patent [19]
Alsmeier et al.

[11] Patent Number: 5,627,092
[45] Date of Patent: May 6, 1997

[54] DEEP TRENCH DRAM PROCESS ON SOI FOR LOW LEAKAGE DRAM CELL

[75] Inventors: Johann Alsmeier; Reinhard J. Stengl, both of Wappinger Falls, N.Y.

[73] Assignee: Siemens Aktiengesellschaft, Munich, Germany

[21] Appl. No.: 313,507

[22] Filed: Sep. 26, 1994

[51] Int. Cl.$^6$ .............................. H01L 21/70; H01L 27/00
[52] U.S. Cl. ...................... 438/152; 438/388; 438/392
[58] Field of Search ............................. 437/47, 52, 60, 437/919, 203

[56] References Cited

U.S. PATENT DOCUMENTS

| | | | |
|---|---|---|---|
| 4,601,779 | 7/1986 | Abernathey et al. | 156/628 |
| 4,694,561 | 9/1987 | Lebowitz | 437/52 |
| 4,801,988 | 1/1989 | Kenney . | |
| 4,839,309 | 6/1989 | Easter et al. | 437/160 |
| 4,864,375 | 9/1989 | Teng et al. . | |
| 4,914,628 | 4/1990 | Nishimura | 365/149 |
| 4,914,740 | 4/1990 | Kenney . | |
| 4,916,524 | 4/1990 | Teng et al. . | |
| 4,918,500 | 4/1990 | Inuishi . | |
| 4,939,104 | 7/1990 | Pollack et al. | 437/162 |
| 4,963,502 | 10/1990 | Teng et al. | 437/41 |
| 4,978,634 | 12/1990 | Shen et al. | 437/52 |
| 4,984,039 | 1/1991 | Douglas . | |
| 5,001,526 | 3/1991 | Gotou . | |
| 5,025,295 | 6/1991 | Kuesters et al. . | |
| 5,043,778 | 8/1991 | Teng et al. . | |
| 5,055,898 | 10/1991 | Beilstein, Jr. et al. . | |
| 5,057,887 | 10/1991 | Yashiro et al. . | |
| 5,065,273 | 11/1991 | Rajeevakumar | 361/313 |
| 5,105,245 | 4/1992 | Riemenschneider et al. . | |
| 5,106,777 | 4/1992 | Rodder | 437/67 |
| 5,216,265 | 6/1993 | Anderson et al. | 257/301 |
| 5,234,846 | 8/1993 | Chu et al. | 437/33 |
| 5,264,716 | 11/1993 | Kenney | 257/301 |
| 5,309,008 | 5/1994 | Watanabe | 257/304 |
| 5,331,199 | 7/1994 | Chu et al. | 257/587 |
| 5,336,912 | 8/1994 | Ohtsuki | 257/68 |
| 5,349,218 | 9/1994 | Tadaki | 257/296 |
| 5,362,663 | 11/1994 | Brauner et al. | 437/52 |
| 5,422,294 | 6/1995 | Nohlo | 437/203 |

*Primary Examiner*—H. Jey Tsai
*Attorney, Agent, or Firm*—Adel A. Ahmed; Dexter K. Chin

[57] ABSTRACT

A deep trench DRAM cell is formed on a silicon on isolator (SOI) substrate, with a buried strap formed by outdiffusion of dopant in associated trench node material, for providing an electrical connection between the trench node and the active area of a MOS transfer gate formed in the substrate adjacent the trench in an uppermost portion of the substrate.

17 Claims, 11 Drawing Sheets

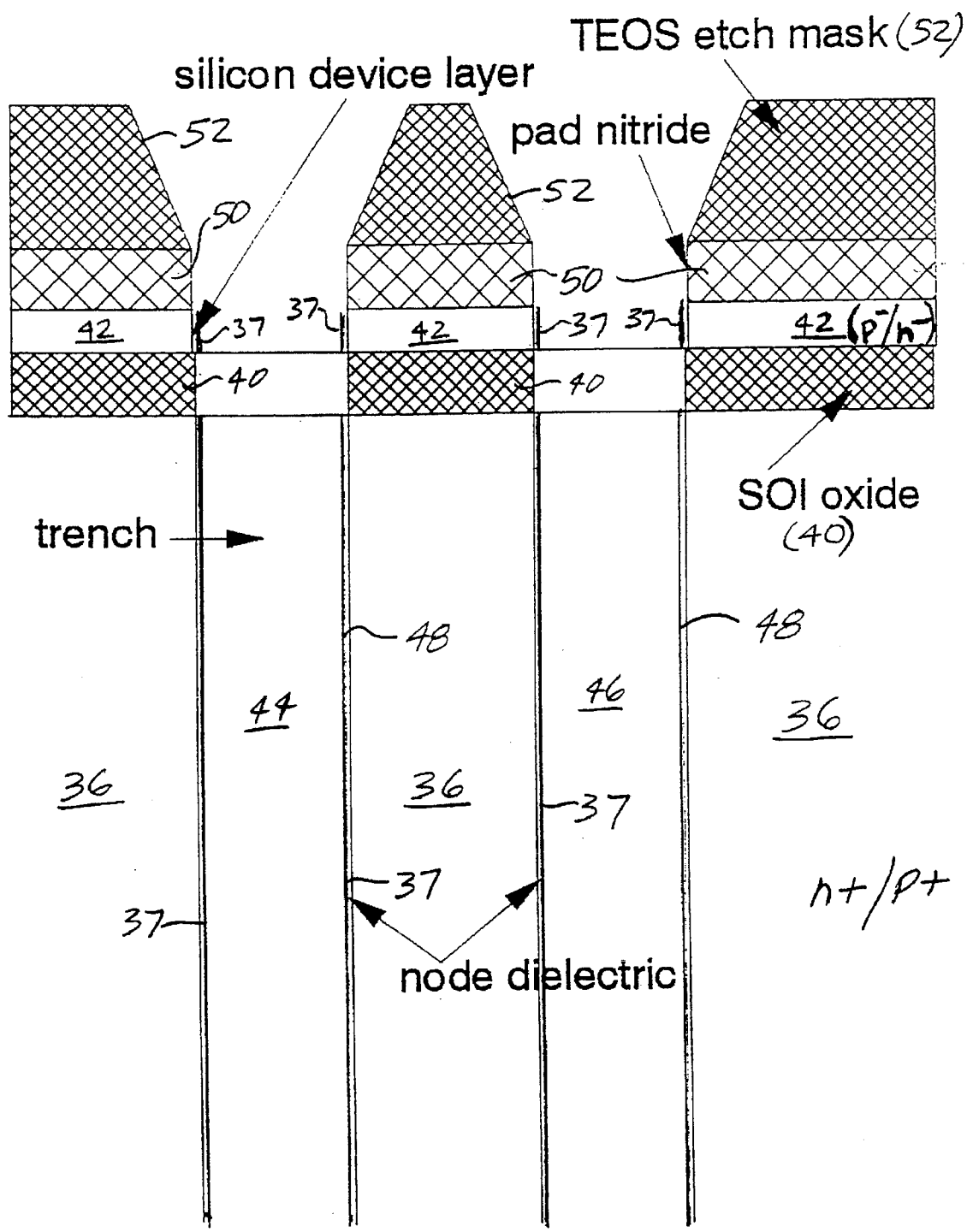
FIG.4.1

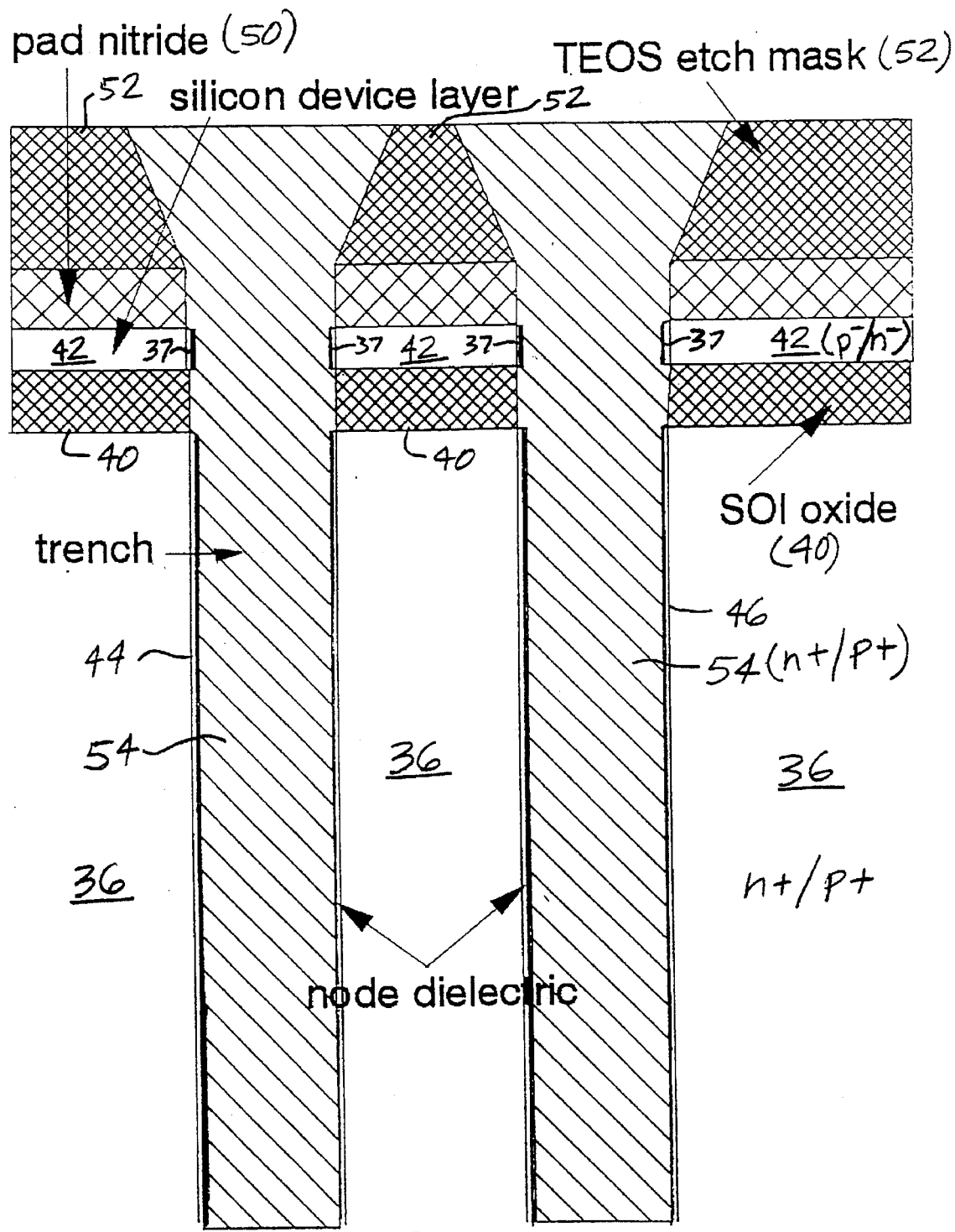
FIG.4.2

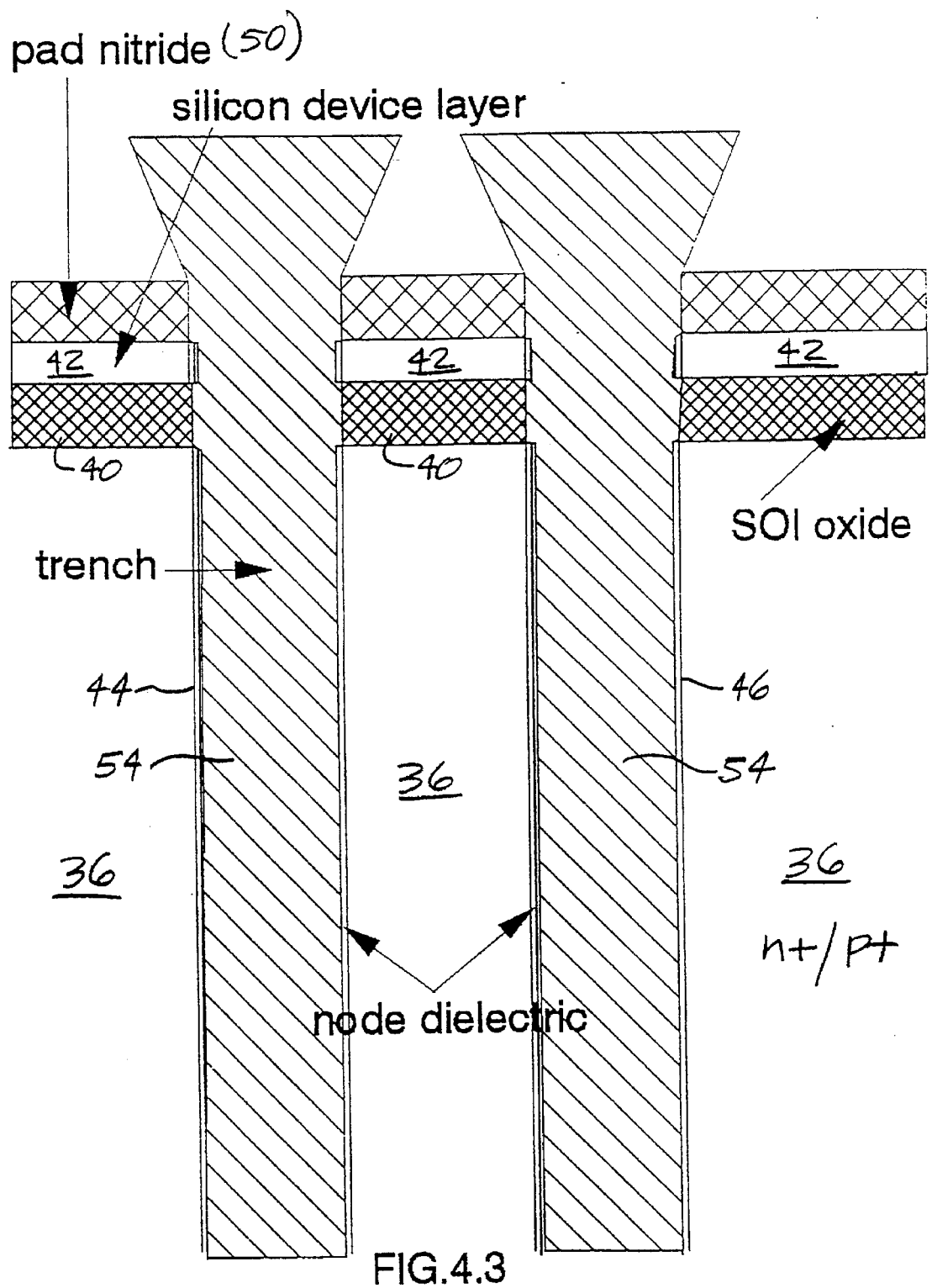
FIG. 4.3

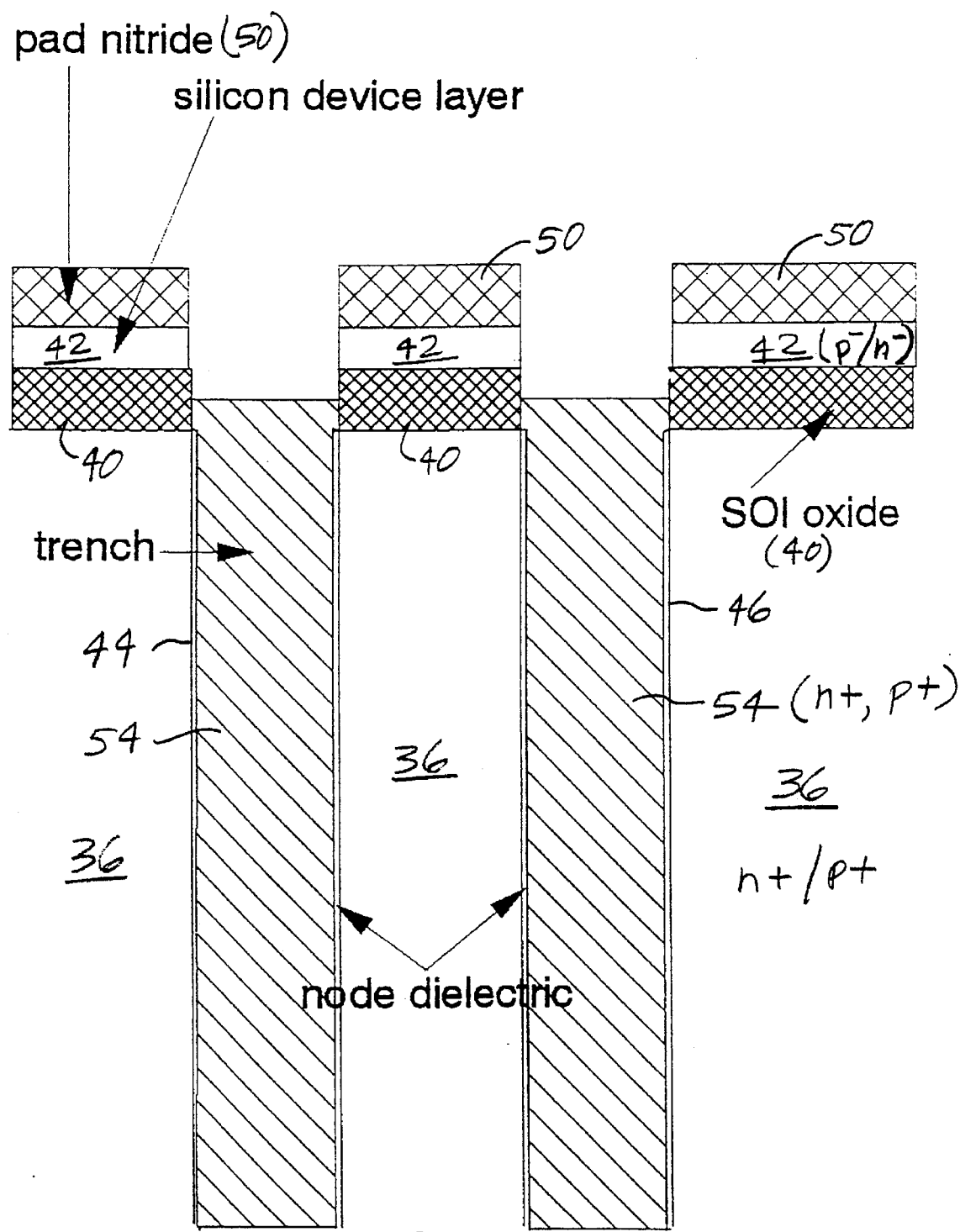
FIG.4.4

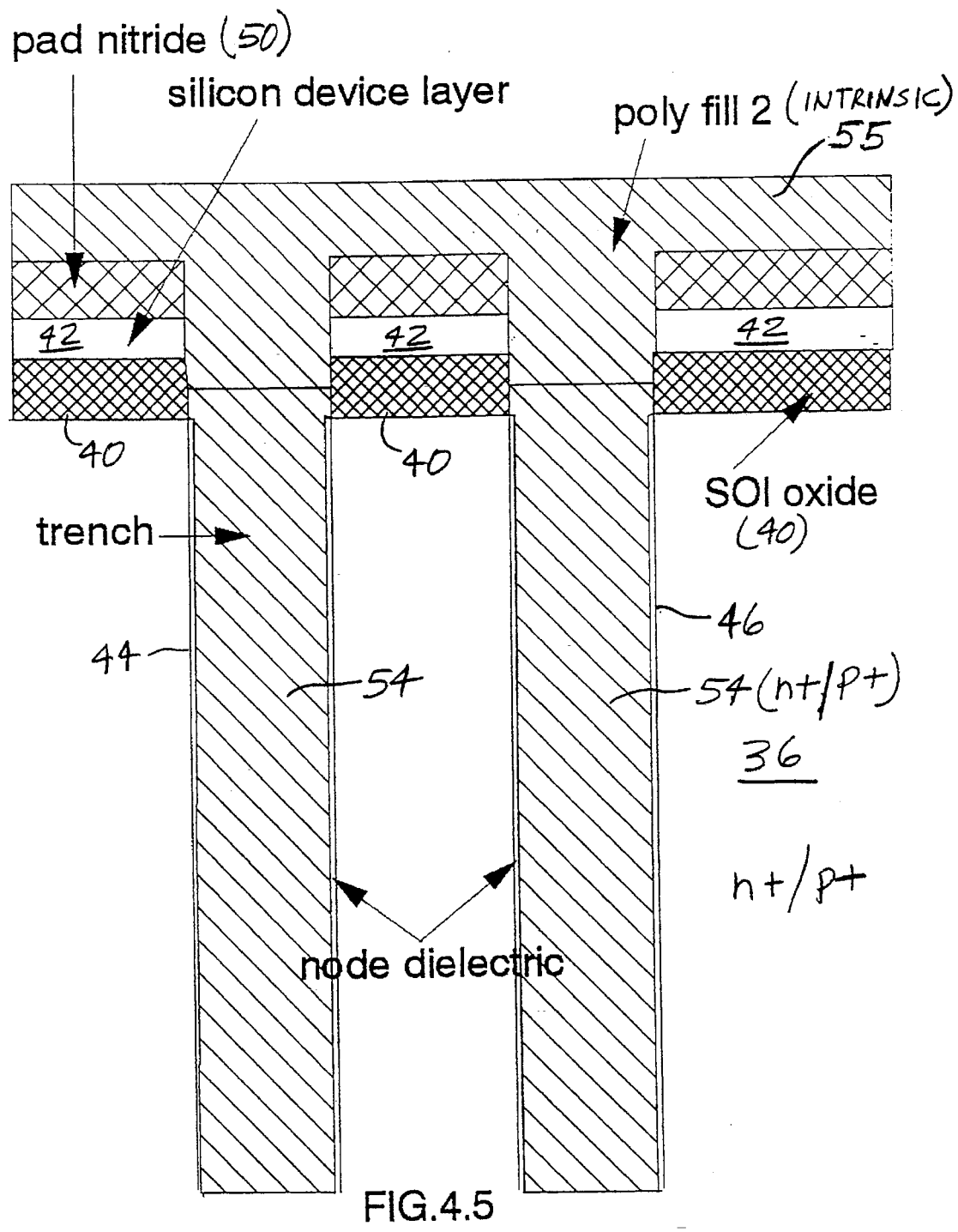
FIG.4.5

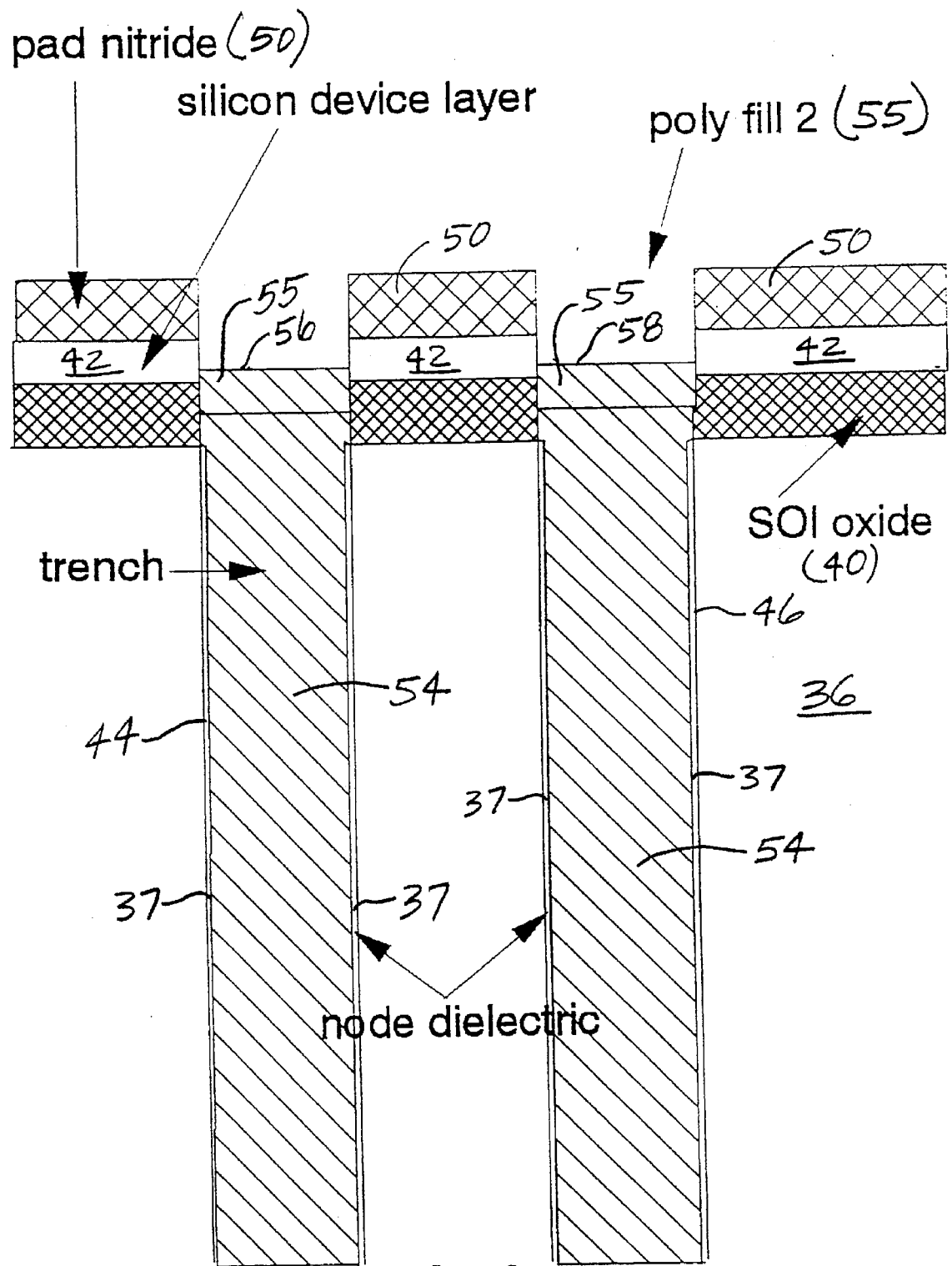
FIG.4.6

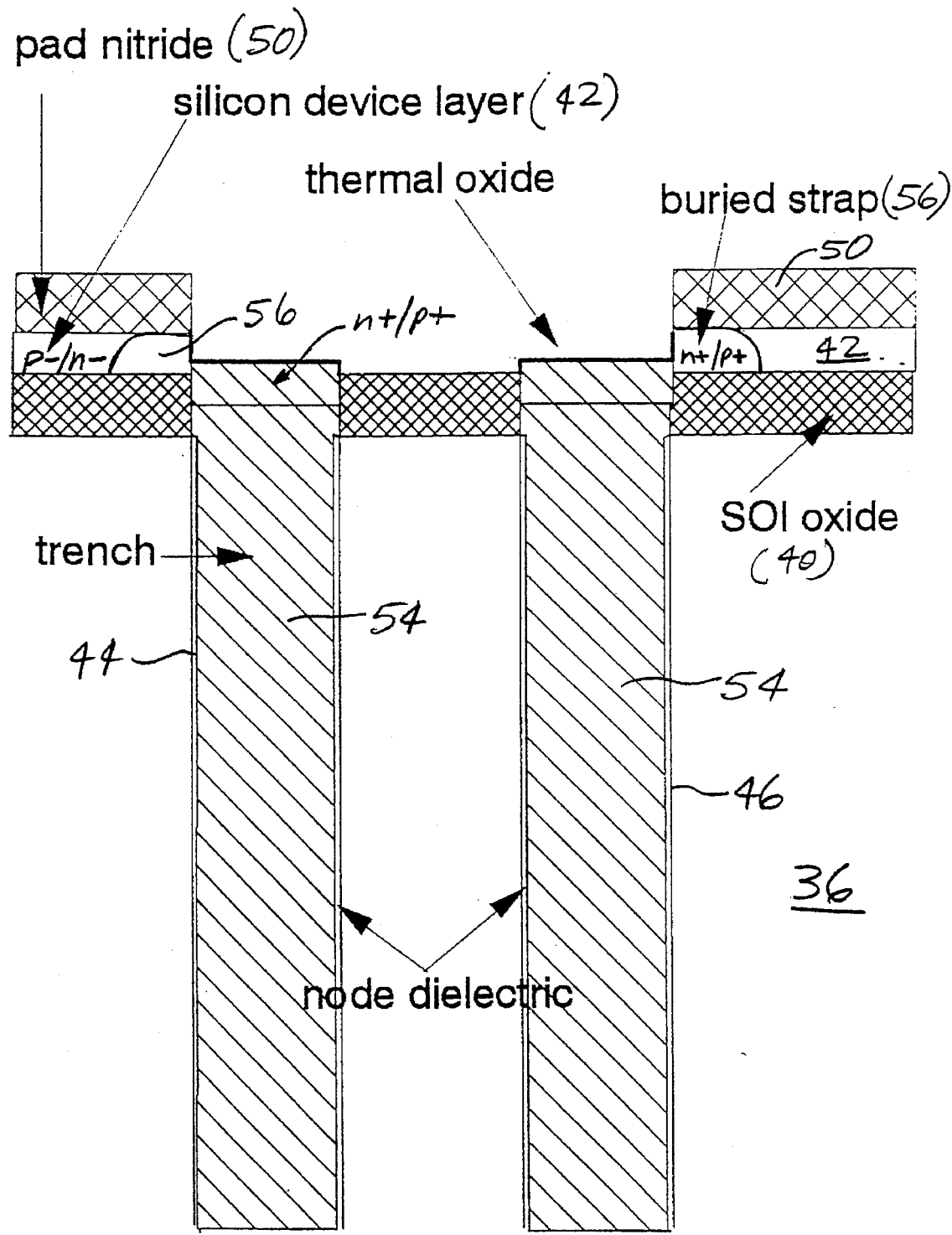
FIG.4.7

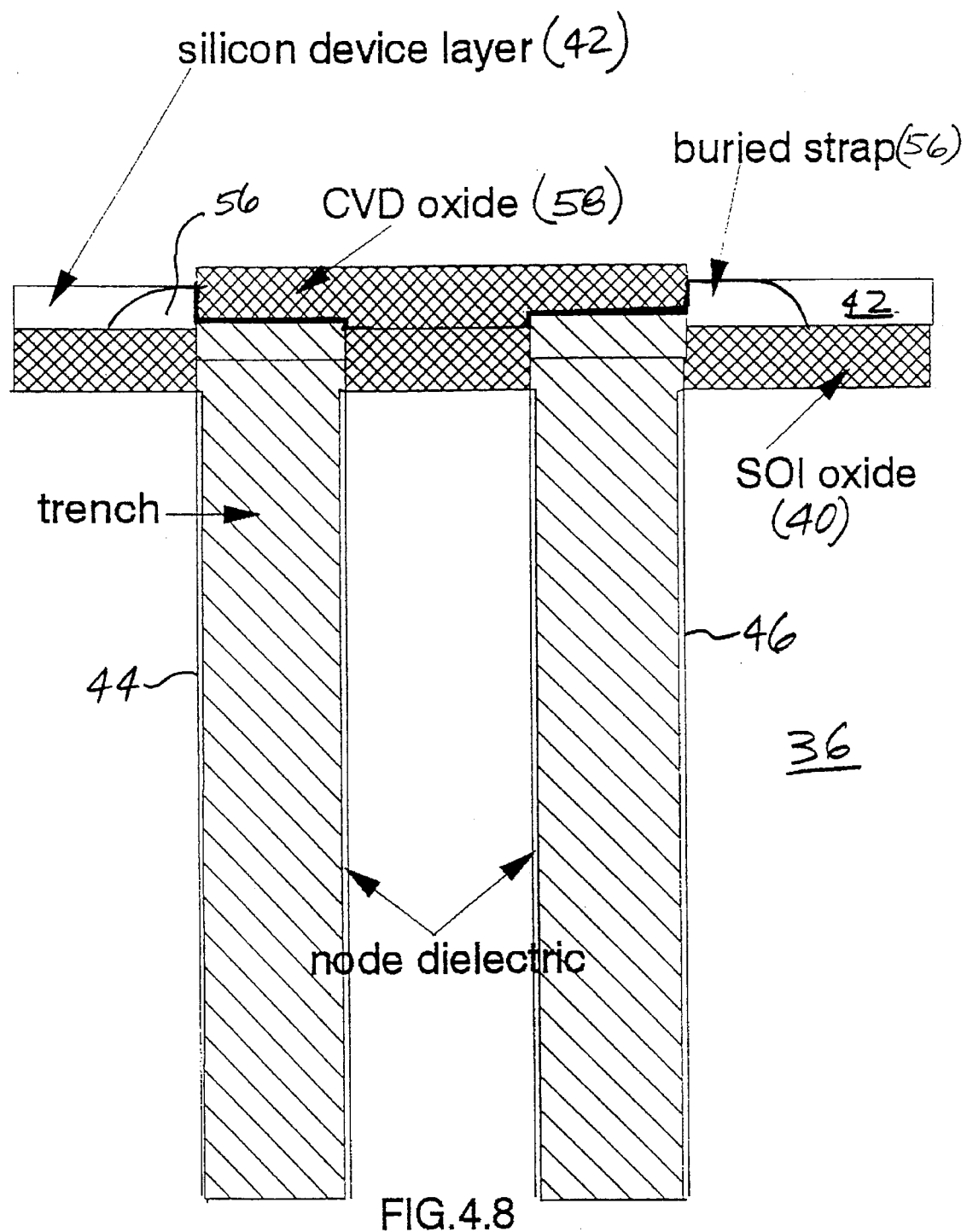
FIG.4.8

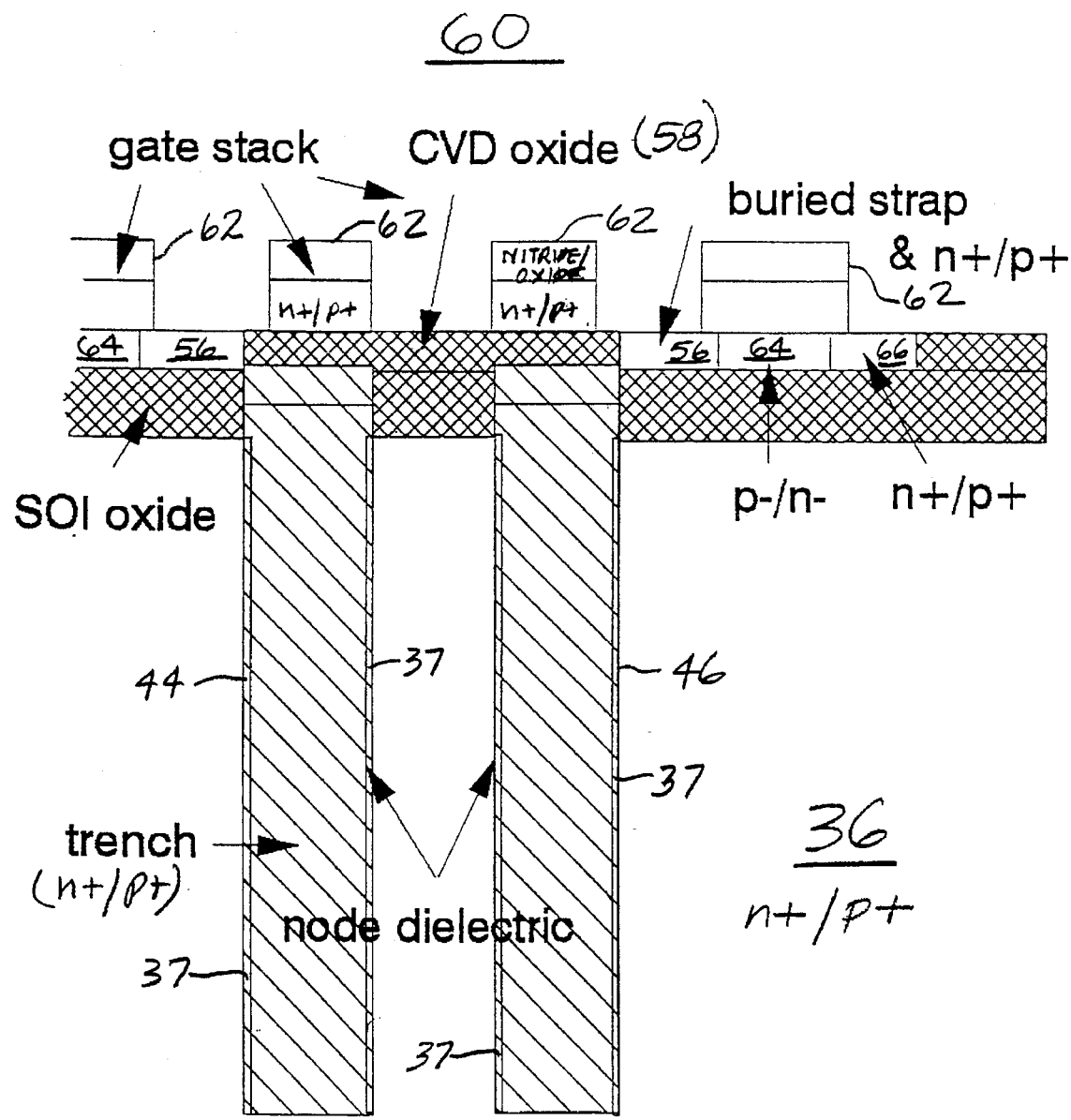
FIG.4.9

5,627,092

DEEP TRENCH DRAM PROCESS ON SOI FOR LOW LEAKAGE DRAM CELL

TECHNICAL FIELD OF THE INVENTION

The present invention relates generally to dynamic random-access memories (DRAM), and more particularly to deep trench DRAM devices and methods for making the same.

BACKGROUND OF THE INVENTION

DRAMs are an acronym for dynamic random-access read-write memories. In such memories, data can only temporarily be stored, requiring that the memory be continually refreshed or the data rewritten into the memory. In a typical DRAM memory capacitors are charged above a predetermined level for storing data, but such storage is temporary because of parasitic leakage currents in the storage cell. However, the small size of DRAM memory cells has resulted in their widespread usage in data processing apparatus. Major research efforts are ongoing in the present field of technology to provide more economic and improved methods for producing DRAMs, and for reducing or eliminating the leakage currents associated with such devices.

As shown in FIG. 1, a typical DRAM cell includes a MOS transistor 3 connected with its channel between a bit line 4 and a node 6, the latter being connected to one end of a capacitor 8, as shown. The other end of capacitor 8 is connected via a node 10 to a source of DC voltage V. The transfer gate 11 of transfer transistor 3 is connected to a word line 12, as shown. Write operations are performed by typically raising the voltage on the word line 12 to a high level for fully turning on transistor 3. Shortly thereafter the bit line 4 is driven high or low for either charging capacitor 8 to a high level voltage, or to a low level reference voltage, such as ground, for example. After performing this write operation, the word line 12 is then returned to a low level of voltage, for turning off transistor 3, causing its channel to go from a low level impedance to a very high level of impedance for isolating node 6, and as a result capacitor 8, from the bit line 4. If capacitor 8 was charged during the write operation, the charge will slowly leak away due to leakage currents inherent in DRAMs. In operating DRAMs, it is therefore necessary to refresh the device or rewrite the data into the device before the voltage on capacitor 8 discharges to a level that is indeterminate for indicating whether the capacitor is storing a digital "1" or "0". Accordingly, DRAM devices can be made more efficient if the leakage currents are reduced, whereby the device will not have to be as refreshed as often.

The typical device configuration for the corresponding equivalent circuit schematic diagram of FIG. 1 for a DRAM, is shown in FIG. 2. This latter figure is illustrative of a DRAM fabricated using known trench technology, wherein a capacitor cell 14 is fabricated by etching a deep trench 16 into an associated semiconductor substrate 18. A thin dielectric or node dielectric 19 is deposited on the inside wall of the trench 16, followed by filling the trench 16 with a highly n+ doped polysilicon or polyfill 20, in this example. The polysilicon 20 and the semiconductor substrate 18 are equivalent to the two electrodes of the DRAM's capacitor 8. Two n+ doped wells 22 and 24 are formed in the p-doped substrate 18, for providing the drain and source electrodes for the transistor 3. Dislocations generated around the trench cell 16 during processing for producing the DRAM cell are the primary contributors to leakage currents that tend to discharge the capacitor 8.

A buried plate 26 is provided in a n+ doped region within substrate 18, as shown. The highly doped buried plate region 26 surrounds a substantial portion of the trench 16, in order to enhance the use of the semiconductor substrate 18 as a viable capacitor-electrode. A small parasitic transistor 28 is shown schematically as being located between the buried plate 26 and a drain (or source) 22 of the transfer MOS transistor 3. Note that the node dielectric 19 acts as a gate oxide for the parasitic transistor 28. The parasitic transistor 28 tends to discharge the capacitor 8 during storage time periods, but in the extreme this parasitic capacitor 28 may also short the trench capacitor 8 formed in the substrate 18.

In using known technology, dislocations around deep trenches filled with oxide and polysilicon in a monocrystalline silicon substrate are difficult to control. It is believed that stress generated by the different thermal expansion coefficients of the trench 16 while being filled with polysilicon 20, relative to the semiconductor substrate 18, contributes to the control problems. It is preferred that trenches such as trench 16 be filled with highly doped polysilicon in a manner substantially avoiding any voids, in order to minimize stress. Care must also be taken in subsequent processing to substantially avoid oxidation of the sidewalls of the trench 16. These problems can presently only be minimized using known technology by employing an extraordinary amount of engineering time and regulating the associated process flow.

Also, in using presently known DRAM-trench technology, the parasitic transistor 28 cannot be completely eliminated. However, the parasitic transistor 28 can be substantially reduced through use of a collar oxide 30, as shown in FIG. 3, in place of an upper portion of a thin node dielectric 19. The thick collar oxide 30 serves to increase the threshold voltage of the parasitic transistor 28 to values higher than those typically encountered during normal operation of a DRAM cell, thereby reducing the negative effects of the parasitic transistor 28. Note also the use of a strap 32 for connecting drain (or source) electrode 22 to the polyfill 20 of trench 16 representing one plate of capacitor 8.

SUMMARY OF THE INVENTION

In order to overcome the problems in the prior art, the present inventors have developed a DRAM cell produced from a process using an SOI (Silicon on Insulator) substrate, in combination with simplified processing. In one embodiment of the invention, an SOI substrate is used to fabricate DRAM cells in trench technology for isolating the transfer MOS transistor from the trench environment, thereby preventing dislocations around the trench from influencing the performance of the cell. In this manner, along the trench sidewall the parasitic transistor is eliminated, thereby avoiding use of a collar oxide, and simplifying the processing. Also, in another embodiment of the invention, by using highly predoped material for the SOI substrate, the requirement for a buried plate process, such as forming buried plate 26, can be eliminated.

BRIEF DESCRIPTION OF THE DRAWING

Various embodiments of the present invention are described below with reference to the drawings, in which like items are identified by the same reference designation, and in which:

FIGS. 4.1 through 4.9 are elevational cross-sectional views showing a plurality of successive processing steps for producing in accordance with various embodiments of the invention a DRAM memory cell.

DETAILED DESCRIPTION

Figure 2:
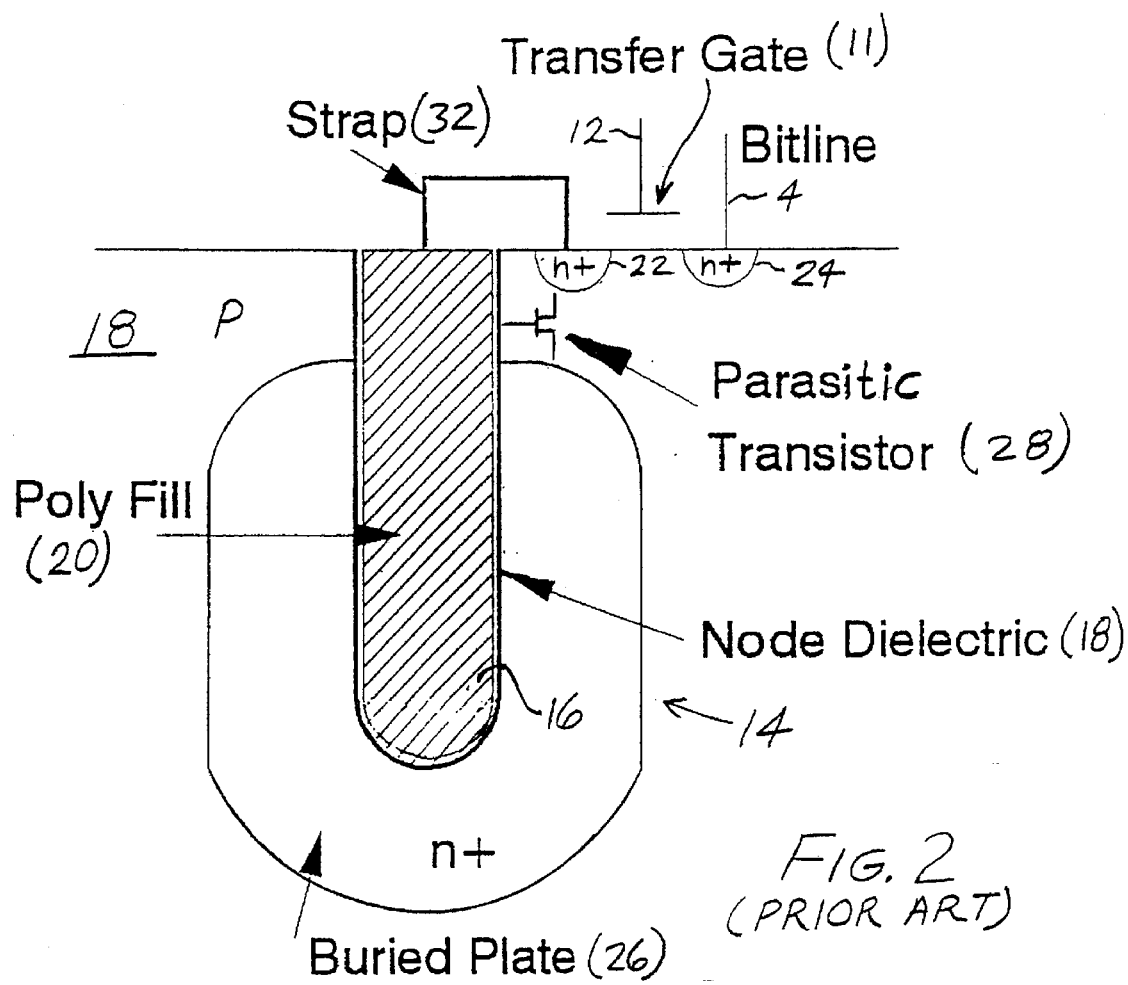
FIG. 2 is a diagram showing the configuration of a prior art DRAM in cross section.
Figure 1:
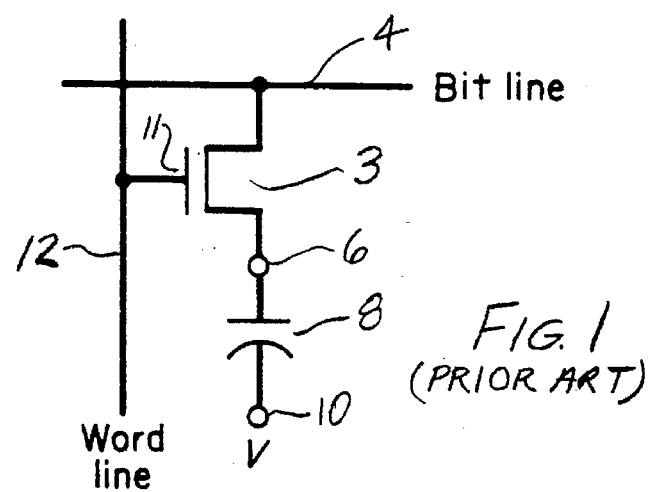
FIG. 1 is a circuit schematic equivalent diagram of the prior art DRAM (Dynamic Random Access Memory) cell of FIG. 2.
Figure 3:
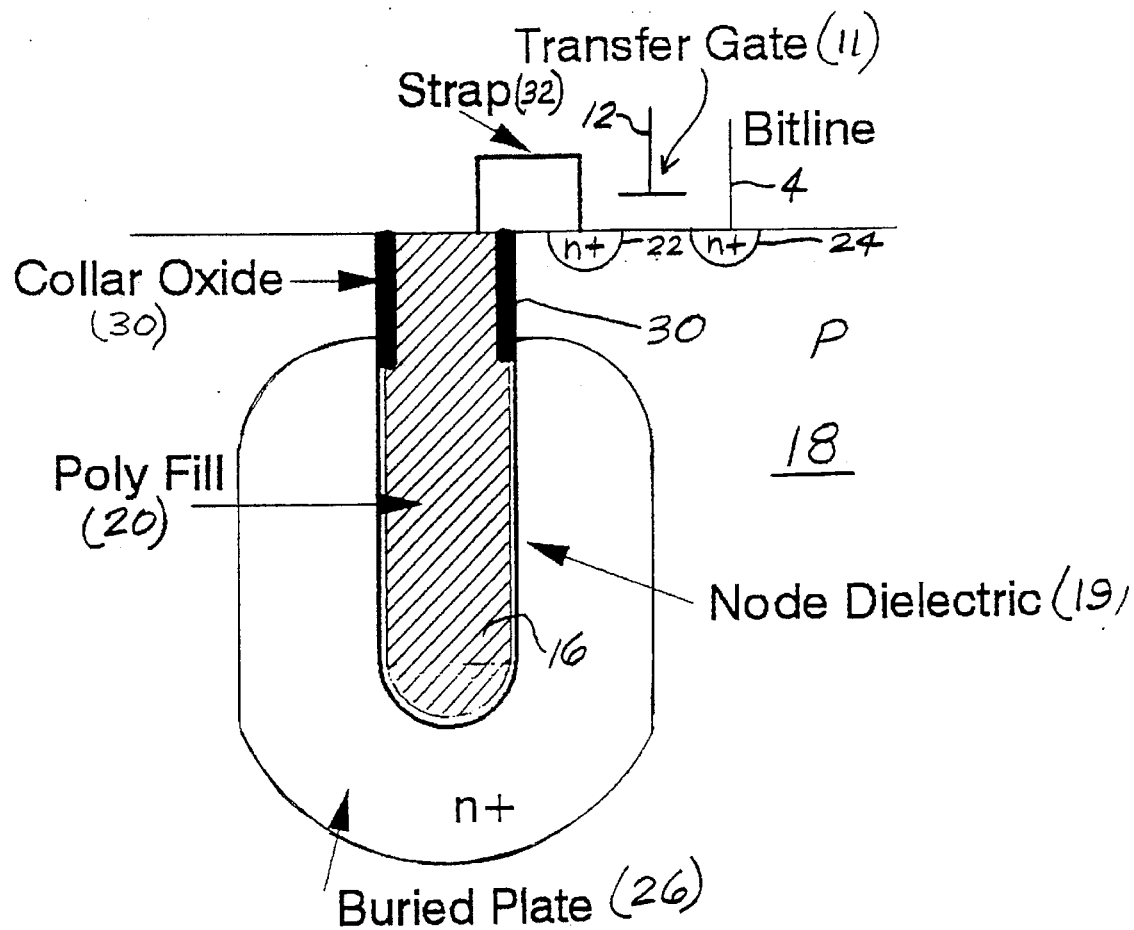
FIG. 3 is a cross sectional view of a prior art DRAM memory cell configuration incorporating a thick collar oxide about an upper portion of a deep trench for reducing parasitic transistor effects.

In one embodiment of the invention, the typical parameters used for the Silicon on Isolator (SOI) semiconductor wafers or substrates 36, include making the substrate n+ doped to $10E17/cm^3$ with a high surface concentration of arsenic of about $10E20/cm^3$ in the first 8 um underneath an SOI oxide layer 40, as shown in FIG. 4.1, for example. In another embodiment the substrate is doped p+. The thickness of the SOI oxide layer 40 is typically 300 nm (nanometers). Also, a thin silicon device layer 42 is provided that is typically no greater in thickness than 100 nm, and may be thinner.

In one embodiment of the invention, a DRAM memory cell is produced through use of processing steps as illustrated in steps 4.1 through 4.9, to which reference will now be made. As in presently known conventional processing, the initial processing steps begin as shown in FIG. 4.1 with etching of trenches 44 and 46, and the use of node oxidation nitridation for forming the node dielectric layers 48 on the interior walls of the trenches 44 and 46, respectively. Pad nitride layers 50 are formed over the silicon device layers, as shown. Also, a TEOS etch mask layer 52 is formed over the pad nitride layers 50, as shown.

With reference to FIG. 4.2, the next step is to fill the trenches 44 and 46 with a highly doped n+/p+ polysilicon material 54 from the bottoms of the trenches, respectively, extending to the top level of the TEOS etch mask layers 52. The next step is then to remove the TEOS etch mask 52, as shown in FIG. 4.3, using conventional techniques.

The following step, shown in FIG. 4.4, is to recess etch the polysilicon 54 down to about the mid-level of the SOI insulation oxide layers 40, as shown, in this example. Also, the node oxide layers 37 are removed by isotropic etching from the ends of the thin silicon device layers 42, as shown.

As shown in FIG. 4.5, the upper portions of the trenches 44 and 46 are then refilled with polysilicon material 55 (intrinsic), particularly shown as the "poly fill 2", above the prior poly fill 54. The next step is to perform a second recess etch typically down to the middle of the active silicon device layer 42, as shown in FIG. 4.6. In the commonly known "active area etch" the nitride layer 50 and the silicon device layer between two adjacent trenches 44 and 46, in this example, is etched away down to the SOI oxide layer 40. The remaining polysilicon studs are then thermally oxidized typically at 800° C. to 1050° C., to an oxide thickness 43 of about 20 nm. This thermal oxidation step also causes outdiffusion of arsenic from the highly doped n+ polysilicon material 54, in this example, through the remaining polysilicon material 55, into the thin silicon device layer portions 42. This outdiffusion, in the preferred embodiment is about 100 nm, and provides a drain (or source) for the associated MOS transistor, and is otherwise known in the art as a "buried strap" 56, as shown in FIG. 4.7.

With reference to FIG. 4.8, in the next step, the remaining gaps between active silicon islands represented by portions of the silicon device layer 42 that remain, are filled with chemical vapor deposits (CVD) oxide 58 that is planarized down to the pad nitride layer portions 50. The latter are removed after planarization, and the active areas are oxidized with gate sacrificial oxide (typically 15 nm).

With reference to FIG. 4.9, after necessary deposition, lithography, and etch steps are performed, the implantations for NMOS or PMOS devices are performed using conventional or known processing steps. The DRAM cell device 60 results, after all of these steps have been performed. The DRAM 60 includes gate stacks 62 (each including an n+/p+ layer 68, and an upper intrinsic layer 70 of nitride oxide, in this example), channel region 64, source (or drain) region 66, and drain (or source) region 56, for providing transfer MOS transistor 3.

Note that the doping process for the buried plate 56 can be omitted if a highly predoped material is used for the SOI substrate 36. Such material can be obtained by using a known wafer bonding technique.

The MOS transistor 3 is also completely isolated from the environment of the trenches 44 and 46, resulting in the performance of the MOS transistor 3 being enhanced in that it is not affected by any dislocations relative to trenches 44 and 46. Also, as shown above, the requirement as in the prior art for a collar oxide 30 has been eliminated, thereby simplifying the processing steps for producing DRAM 60. The DRAM 60 is also radiation hardened, and no vertical transistor action is possible due to the use of the buried oxide or strap 56, as taught. Also, through use of the present method of producing DRAM 60, in certain applications permitting a low doped SOI substrate 36, $V_{plate}$ operation at 0 volts can be obtained, instead of $V_{dd}/2$ operation as required with highly doped substrates 36, thereby eliminating latch up problems, whereby the CMOS switching behavior is not effected relative to DRAM 60.

In one embodiment of the invention, as shown in FIGS. 4.1 through 4.9, substrate 36 is doped n+, the thin silicon device layer 42 is doped p−, the polysilicon 54 is doped n+, the drain and source regions 56 and 66 of MOS transistor 3 are doped n+, the channel region 64 thereof is doped p−, and the first layer of the gate stacks 62 are doped n+. In another embodiment of the invention, substrate 36 is doped p+, the thin silicon device layer 42 is doped n−, the polysilicon 54 is doped p+, the drain and source regions 56 and 66 of MOS transistor 3 are doped p+, and the channel region thereof is doped n−, and the first layer 68 of the gate stacks 62 are doped p+. The top layer 70 of each gate stack 62 is intrinsic, and in this example is formed of nitride oxide.

Although various embodiments of the present invention have been shown and described above, they are not meant to be limiting. Certain modifications to these embodiments may occur to those of skill in the art, which modifications are meant to be covered by the spirit and scope of the appended claims.

What is claimed is:

1. A method for forming a dynamic random access memory cell (DRAM), comprising the steps of:

doping a silicon on isolator (SOI) substrate with dopants of a first conductivity type;

forming an SOI oxide layer on said substrate;

forming a silicon device layer over said SOI oxide layer;

doping said silicon device layer with dopants of a second conductivity type opposite that of said first conductivity type;

forming a pad nitride layer over said silicon device layer;

forming a TEOS etch mask layer over said pad nitride layer;

etching a trench into said substrate at a first region thereof;

forming a dielectric layer on interior walls of said trench;

filling said trench to the top level of said TEOS etch mask layer with a polysilicon material doped to said first conductivity type;

removing said TEOS etch mask layer;

recess etching said polysilicon material down to about the mid-level of said SOI oxide layer;

isotropic etching away said dielectric layer from end portions of said silicon device layers;

refilling said trench with intrinsic polysilicon material above the remaining first conductivity type doped polysilicon material;

recess etching said intrinsic polysilicon material down to about the middle of said silicon device layer, thereby leaving a polysilicon stud protruding from said trench;

etching away said pad nitride layer and said silicon device layer on one side of said trench, using the associated portion of said SOI oxide layer as an etch stop;

thermally oxidizing said polysilicon stud, while permitting outdiffusion of dopant material from the underlying doped polysilicon material, into and through a remaining portion of initially intrinsic polysilicon material, into an adjacent portion of said silicon device layer on an opposite side of said trench for providing a buried strap;

chemical vapor depositing (CVD) an oxide layer over said polysilicon stud and said SOI layer adjacent said one side of said trench to above the top level of said silicon device layer adjacent the opposite side of said trench;

planarizing said CVD oxide to the level of the remaining portion of said silicon device layer;

oxidizing said silicon device layer with gate sacrificial oxide; and implanting an MOS transistor switch including adjacent drain, channel, and source regions in said silicon device layer, with a gate stack consisting of a first gate layer of said first conductivity overlying said channel region, and portions of said drain and source regions, and an intrinsic second gate layer overlying said first gate layer.

2. The method of claim 1, wherein said substrate is doped to $10E17/cm^3$.

3. The method of claim 2, wherein said substrate is doped to have a surface concentration of arsenic of about $10E20/cm^3$ in the first 8 um beneath said SOI oxide layer.

4. The method of claim 1, wherein said SOI layer is about 300 nanometers thick.

5. The method of claim 1, wherein said silicon device layer has a thickness of about 100 nanometers or less.

6. The method of claim 1, wherein said thermal oxidizing step is carried out at a temperature ranging from about 800° C. to 1050° C.

7. The method of claim 1, wherein said dielectric layer is formed by node oxidation and nitridation.

8. The method of claim 1, wherein in said thermal oxidizing step said polysilicon stud is oxidized to produce an oxide thickness of about 20 nm.

9. The method of claim 1, wherein said thermal oxidizing step dopant material is outdiffused into said silicon device layer for about 100 nm.

10. A method for forming DRAM cells, comprising the steps:

doping a silicon on isolator (SOI) substrate with dopants of a first conductivity type;

forming an SOI oxide layer on said substrate;

forming a silicon device layer over said SOI oxide layer;

doping said silicon device layer with dopants of a second conductivity type opposite that of said first conductivity type;

forming a pad nitride layer over said silicon device layer;

forming a TEOS etch mask layer over said pad nitride layer;

etching a plurality of spaced apart trenches through said pad nitride layer, said silicon device layer, and said SOI oxide layer, into said substrate;

forming a node dielectric layer on interior walls of the plurality of said trenches, respectively;

filling each of said plurality of trenches to the top level of said TEOS etch mask layer with polysilicon material doped to said first conductivity type;

removing said TEOS etch mask layer;

recess etching said polysilicon material associated with said plurality of trenches down to about the mid-level of said SOI oxide layer;

isotropic etching away node oxide layers from ends of said silicon device layer between said plurality of trenches;

refilling said trenches with intrinsic polysilicon material;

recess etching said intrinsic polysilicon material down to the middle of the level of associated portions of said silicon device layer to form silicon studs;

etching away said pad nitride layer and said silicon device layer between individual pairs of said trenches, using an associated underlying SOI layer portion as an etch stop;

thermally oxidizing polysilicon studs associated with each of said individual pairs of said trenches, concurrent with causing outdiffusion of dopant from said doped polysilicon material through overlying intrinsic polysilicon material, and into portions of adjacent silicon device, respectively, thereby providing buried straps, respectively;

filling gaps between remaining portions of said silicon device layer with chemical vapor deposit (CVD) oxide;

planarizing said CVD oxide to said pad nitride layer;

removing said pad nitride layer via planarization;

oxidizing remaining portions of said silicon device layer with gate sacrificial oxide; and implanting a MOS transistor in each remaining portion of said silicon device layer.

11. The method of claim 10, wherein said substrate is doped to $10E17/cm^3$.

12. The method of claim 10, further including the step of doping said substrate to have a high surface concentration of dopant of about $10E20/cm^3$ in the first 8 um beneath said SOI oxide layer.

13. The method of claim 10, wherein said SOI layer is about 300 nanometers thick.

14. The method of claim 10, wherein said silicon device layer is about 100 nanometers thick.

15. The method of claim 10, wherein said thermal oxidizing step is carried out at a temperature ranging from about 800° C. to 1,050° C.

16. The method of claim 10, wherein said thermal oxidizing step is carried out to provide an oxide thickness of about 20 nm.

17. The method of claim 10, wherein said thermal oxidizing step is controlled to provide an outdiffusion of 100 nm into said silicon device layer portions.

* * * * *